US007985449B2

(12) United States Patent
Garg et al.

(10) Patent No.: US 7,985,449 B2
(45) Date of Patent: *Jul. 26, 2011

(54) METHODS FOR DEPOSITING METAL FILMS ONTO DIFFUSION BARRIER LAYERS BY CVD OR ALD PROCESSES

(75) Inventors: Diwakar Garg, Emmaus, PA (US); Hansong Cheng, Allentown, PA (US); John Anthony Thomas Norman, Encinitas, CA (US); Eduardo Machado, Barcelona (ES); Pablo Ordejon, Barcelona (ES)

(73) Assignee: Air Products and Chemicals, Inc., Allentown, PA (US)

( * ) Notice: Subject to any disclaimer, the term of this patent is extended or adjusted under 35 U.S.C. 154(b) by 604 days.

This patent is subject to a terminal disclaimer.

(21) Appl. No.: 11/738,187

(22) Filed: Apr. 20, 2007

(65) Prior Publication Data

US 2007/0190779 A1 Aug. 16, 2007

Related U.S. Application Data

(62) Division of application No. 10/428,447, filed on May 2, 2003, now Pat. No. 7,311,946.

(51) Int. Cl.
C23C 16/06 (2006.01)

(52) U.S. Cl. ............. 427/250; 427/255.394; 427/255.7; 427/564; 427/576; 427/584; 427/249.15; 427/249.17; 427/404; 427/419.7

(58) Field of Classification Search .................. 427/250, 427/255.394, 255.7, 564, 576, 584, 249.15, 427/249.17, 404, 419.7
See application file for complete search history.

(56) References Cited

U.S. PATENT DOCUMENTS

| | | | |
|---|---|---|---|
| 4,661,375 A * | 4/1987 | Thomas | 438/614 |
| 5,019,531 A | 5/1991 | Awaya et al. | |
| 5,085,731 A | 2/1992 | Norman et al. | |
| 5,094,701 A | 3/1992 | Norman et al. | |
| 5,098,516 A | 3/1992 | Norman et al. | |
| 5,135,801 A * | 8/1992 | Nystrom et al. | 428/216 |
| 5,242,860 A | 9/1993 | Nulman et al. | |
| 5,434,044 A | 7/1995 | Nulman et al. | |
| 5,521,120 A | 5/1996 | Nulman et al. | |
| 5,567,987 A | 10/1996 | Lee | |
| 5,580,823 A | 12/1996 | Hegde et al. | |
| 5,654,235 A | 8/1997 | Matsumoto et al. | |
| 5,665,209 A | 9/1997 | Byun | |
| 5,776,830 A | 7/1998 | Sumi et al. | |
| 5,776,831 A | 7/1998 | Padmanabhan et al. | |
| 5,891,513 A | 4/1999 | Dubin et al. | |
| 5,925,225 A | 7/1999 | Ngan et al. | |
| 5,973,402 A | 10/1999 | Shinriki et al. | |
| 6,114,764 A | 9/2000 | Hoshino et al. | |
| 6,150,268 A | 11/2000 | Iacoponi et al. | |
| 6,165,555 A | 12/2000 | Jun et al. | |
| 6,303,490 B1 | 10/2001 | Jeng | |
| 6,334,249 B2 | 1/2002 | Hsu | |
| 6,344,411 B1 | 2/2002 | Yamada et al. | |
| 6,413,864 B1 | 7/2002 | Pyo | |
| 6,423,201 B1 | 7/2002 | Mandrekar | |
| 6,475,902 B1 | 11/2002 | Hausmann et al. | |
| 6,491,978 B1 | 12/2002 | Kalyanam | |
| 6,509,266 B1 | 1/2003 | Ciotti et al. | |
| 6,545,357 B2 | 4/2003 | Chopra | |
| 6,548,402 B2 | 4/2003 | Wang et al. | |
| 6,562,715 B1 | 5/2003 | Chen et al. | |
| 6,743,473 B1 | 6/2004 | Parkhe et al. | |
| 6,869,876 B2 | 3/2005 | Norman et al. | |
| 6,955,986 B2 | 10/2005 | Li | |
| 7,018,917 B2 | 3/2006 | Elers | |
| 7,524,533 B2 * | 4/2009 | Garg et al. | 427/250 |
| 2001/0054769 A1 | 12/2001 | Raaijmakers et al. | |
| 2002/0013487 A1 | 1/2002 | Norman et al. | |
| 2002/0043468 A1 | 4/2002 | Mikkola et al. | |
| 2003/0145790 A1 | 8/2003 | Sakamoto et al. | |
| 2004/0137158 A1 * | 7/2004 | Kools et al. | 427/404 |

FOREIGN PATENT DOCUMENTS

| | | |
|---|---|---|
| EP | 0 818 559 A2 | 1/1998 |
| EP | 1 029 943 A1 | 8/2000 |
| EP | 1 142 894 A2 | 10/2001 |
| EP | 1 180 553 A | 2/2002 |
| EP | 1 180 553 A1 | 2/2002 |
| JP | 96127870 A | 5/1996 |

(Continued)

OTHER PUBLICATIONS

Roh, Woo-Cheol, et al., "Diffusion Barrier Characteristics of Hf(C,N) Thin Films Deposited by Plasma Enhanced Metal Organic Chemical Vapor Deposition for Cu Metallization". Jpn, J. Appl. Phys. vol. 37 (1998) pp. L406-L408.*

Rha, Sa-Kyun, et al., "Improved TiN film as a diffusion barrier between copper and silicon". Thin Solid Films 320 (1998), pp. 134-140.*

Becker, Jill S., et al., "Diffusion barrier properties of tungsten nitride films grown by atomic layer deposition from bis(tert-butylimido)bis(dimethlyamido)tungsten and ammonia". Applied Physics Letters, vol. 82, No. 14, Apr. 7, 2003, pp. 2239-2241.*

U.S. Appl. No. 60258471, filed Dec. 20, 1985, Shiotani Yoshimi, Absrtact.

(Continued)

Primary Examiner — Bret Chen
(74) Attorney, Agent, or Firm — Rosaleen P. Morris-Oskanian

(57) ABSTRACT

A process is described for depositing a metal film on a substrate surface having a diffusion barrier layer deposited thereupon. In one embodiment of the present invention, the process includes: providing a surface of the diffusion barrier layer that is substantially free of an elemental metal and forming the metal film on at least a portion of the surface via deposition by using a organometallic precursor. In certain embodiments, the diffusion barrier layer may be exposed to an adhesion promoting agent prior to or during at least a portion of the forming step. Suitable adhesion promoting agents include nitrogen, nitrogen-containing compounds, carbon-containing compounds, carbon and nitrogen containing compounds, silicon-containing compounds, silicon and carbon containing compounds, silicon, carbon, and nitrogen containing compounds, or mixtures thereof. The process of the present invention provides substrates having enhanced adhesion between the diffusion barrier layer and the metal film.

17 Claims, No Drawings

FOREIGN PATENT DOCUMENTS

| | | |
|---|---|---|
| JP | 2000219968 A | 8/2000 |
| WO | WO 99/00830 | 1/1999 |
| WO | WO 00/71550 A1 | 11/2000 |

OTHER PUBLICATIONS

E. T. Eisenbraun, et al., "Enhanced Growth of Device-Quality Copper by Hydrogen Plasma-Assisted Chemical Vapor Deposition," Appl. Phys. Lett. 60 (25), pp. 3126-3128 (1992).

H. J. Jin, et al., "Plasma-Enhanced Metal Organic Chemical Vapor Deposition of High Purity Copper Thin Films Using Plasma Reactor with the H Atom Source," J. Vac. Sci. Technol. A 17(3), pp. 726-730 (1999).

S. K. Lakshmanan, et al., "A Novel Model of Hydrogen Plasma Assisted Chemical Vapor Deposition of Copper," Thin Solid Films 338, pp. 24-39 (1999).

J. A. T. Norman, et al., "Chemical Additives for Improves Copper Chemical Vapor Deposition Processing," Thin Solid Films 262, pp. 46-51 (1995).

G. A. Petersen, et al., "Enhanced Chemical Vapor Deposition of Copper from (hfac)Cu(TMVS) Using Liquid Coinjection of TMVS," J. Electrochem Soc., vol. 142, No. 3, pp. 939-944 (1995).

A. V. Gelatos, et al., "Chemical Vapor Deposition of Copper from Copper$^{+1}$ Precursors in the Presence of Water Vapor," Appl. Phys. Lett. 63 (20), pp. 2842-2844 (1993).

S-W K., et al., "(hfac)Cu(I)(MP) (hfac=hexafluoroacetylacetonate, MP=4-methyl-I-pentene) and (hfac)(Cu(I)(DMB) (DMB=3,3-dimethyl-I-butene) for the Chemical Vapor Deposition of Copper Film," Thin Solid Films, pp. 10-13 (1999).

E. S. Hwang, et al., "Surfactant-Catalyzed Chemical Vapor Deposition of Copper Thin Films," Chem Mater. 12, pp. 2076-2081 (2000).

T. Nguyen, et al., "Stress and Adhesion of CVD Copper and Tin," Mat. Res. Soc. Symp. Proc. vol. 356, pp. 859-862 (1995).

R. Kröger, et al., "Nucleation and Growth of CVD Cu Films," Mat. Res. Soc. Symp. Proc. vol. 564, pp. 237-241 (1999).

R. Kröger, et al., "Properties of Copper Films Prepared by Chemical Vapor Deposition for Advanced Metallization of Microelectronic Devices," Journal of the Electrochemical Society, 146 (9), pp. 3248-3254 (1999).

M. Juppo, et al., "Deposition of Copper Films by an Alternate Supply of CuCl and Zn," J. Vac. Sci. Technol. A 15(4), pp. 2330-2333 (1997).

P. Martensson, et al., "Atomic Layer Epitaxy of Copper," J. Electrochem. Soc., vol. 145, No. 8, pp. 2926-2931 (1998).

R. Solanki, et al., "Atomic Layer Deposition of Copper Seed Layers," Electrochemical and Solid-State Letters, 3(10), pp. 479-480 (2000).

K. Holloway, et al., "Tantalum as a Diffusion Barrier Between Copper and Silicon: Failure Mechanism and Effect of Nitrogen Additions," J. Appl. Phys. 71 (11), pp. 5433-5444 (1992).

M. H. Tsai, et al., "Comparison of the Diffusion Barrier Properties of Chemical-Vapor-Deposited TaN and Sputtered TaN between Cu and Si," J. Appl. Phys. 79 (9), pp. 6932-6938 (1996).

B. Mehrotra, et al., "Properties of Direct Current Magnetron Reactively Sputtered TaN," J. Vac. Sci. Technol. B5 (6), pp. 1736-1740 (1987).

M. J. Buiting, et al., "Kinetical Aspects of the LPCVD of Titanium Nitride from Titanium Tetrachloride and Ammonia," J. Electrochem. Soc., vol. 138, No. 2, pp. 500-505 (1991).

B. H. Weiller, "CVD of Titanium Nitride for Electronic Applications: Gas Phase Chemical Kinetics for Fundamental Principles and Modeling," Electrochemical Society Proceedings, vol. 96(5), pp. 231-238.

T. Q. Li, et al., "Initial Growth and Texture Formation During Reactive Magnetron Sputtering of TiN on Si(111)," J. Vac. Sci. Technol. A 20(3), pp. 583-588 (2002).

G. S. Chen, et al., "Evaluation of Radio-Frequency Sputter-Deposited TiN Thin Films as Diffusion Barriers Between Copper and Silicon," J. Vac. Sci. Technol A 20(2), pp. 479-485 (2002).

A. Bouteville, et al., "Low Temperature Rapid Thermal Low Pressure Chemical Vapor Deposition of (111) Oriented TiN Layers from the TiCl$_4$-NH$_3$-H$_2$ Gaseous Phase," Microelectronic Engineering 37/38, pp. 421-425 (1997).

Marcadal, C., et al., "CVD Process for Copper Interconnection", Microelectronic Engineering 37/38 (1997), pp. 97-103.

Joswig, H., et al., "Improved Performance of Tin-Diffusion Barriers After a Post-Treatment", VMIC Conference, Jun. 12-13, 1990, p. 477.

Wang, M. T., et al., "Barrier Properties of Very Thin Ta and TaN Layers Against Copper Diffusion", J. Electrochem. Soc., vol. 145, No. 7, Jul. 1998, pp. 2538-2545.

Zhang, Jiming, et al., "CVD Cu Process Development and Integration for Sub-0.18 μm Devices", Mt. Res. Soc. Symp. Proc., vol. 564, 1999, pp. 243-249.

Jain A., et al., "Process Development, Film Characterization, and Integration of PECVD W$_2$N as a Diffusion Barrier for Copper Interconnect", Sandhu, Gurtej S., Advanced Metallization Conference in 1998 (AMC 1998), Materials Research Society, pp. 305-311.

Li, C. Y., et al., "Influence of IMP Copper Flash Layer on the Properties of Copper Films Deposited by Metal Organic Chemical Vapor Deposition", Part of the SPIE Conference on Multilevel Interconnect Technology III, SPIE, Sep. 1999, vol. 3883, pp. 46-49, Santa Clara, California.

Kroger, R., et al., "Properties of Copper Films Prepared by Chemical Vapor Deposition for Advanced Metallization of Microelectronic Devices", Journal of the Electrochemical Society, 1999, 146 (9), pp. 3248-3254.

Yang, Daewon, et al., "Evolution of Surface Morphology during Cu(TMVS)(hfac) Sourced Copper CVD", Mat. Res. Soc. Symp. Proc., 2000, vol. 612, pp. D9.16/1-D9.16/6.

Technology Analysis, "Semiconductor Copper Interconnects: How Goes the Implementation?", Gartner Group, Inc., 2000, Oct. 23, 2000, pp. 2-14.

Park, H., "Superfilling CVD of Copper Using a Catalytic Surfactant", IEEE, 2001, pp. 1-3.

Nuesca, G. M., "Surface Effects in the MOCVD of Copper", Mat. Res. Soc. Symp. Proc., 1994, vol. 337, pp. 177-188, Materials Research Society.

Nguyen, Tue, "Stress and Adhesion of CVD Copper and TiN", Mat. Res. Soc. Symp. Proc., 1995, vol. 356, pp. 859-862, Materials Research Society.

Kroger, R., "Nucleation and Growth of CVD Cu Films", Mat. Res. Soc. Symp. Proc., 1999, vol. 564, pp. 237-241, Materials Research Society.

Pan, W., "The Growth Kinetics Study of CVD Cu on TiN Barriers", J. Phys. IV France 11 (2001), pp. Pr3-23-Pr3-30, Sharp Laboratories of America, Inc. 5700 NW Pacific Rim Boulevard, Camas, WA 98607, U.S.A.

Park, Woong, "Plasma Pretreatments for Cu-MOCVD", Elsevier, (2001), pp. 80-84, Materials Science and Engineering B85.

Lin, Cheng-Li, "Chemically Vapor Deposited Cu Films on Ar-Plasma-Treated TiN Substrate", Jpn. J. Appl. Phys., (2002), vol. 41, pp. 280-286.

Gandikota, Srinivas, et al., "Adhesion Studies of CVD Copper Metallization"Elsevier Science B.V., Microelectronic Engineering 50 (2000) pp. 547-553.

Voss, Steve, et al., "Chemical Studies of CVD Cu Deposited on Ta and TaN Barriers Under Various Process Conditions", Elsevier Science B.V., Microelectronic Engineering 50 (2000) pp. 501-508.

Marcadal, C., et al., "CVD Process for Copper Interconnection"; Microelectronic Engineering, Elsevier Publishers BV., Amsertdam, NL; vol. 37-38; pp. 97-103; Nov. 1, 1997; XP004103561.

\* cited by examiner

METHODS FOR DEPOSITING METAL FILMS ONTO DIFFUSION BARRIER LAYERS BY CVD OR ALD PROCESSES

CROSS-REFERENCE TO RELATED APPLICATIONS

This application is a divisional application of U.S. application Ser. No. 10/428,447, filed May 2, 2003, which is incorporated herein by reference in its entirety.

BACKGROUND OF THE INVENTION

This invention relates to a diffusion barrier layer and method comprising same upon which a metal film, preferably a copper film, is deposited thereupon. More specifically, the present invention relates to a diffusion barrier layer and method comprising same that improves the adhesion between the diffusion barrier layer and the metal layer.

As the microelectronics industry evolves into ultra-large-scale integration (ULSI), the intrinsic properties of typical metallization materials become the limiting factor in advanced circuit design and manufacture. Aluminum, which has been widely used as the interconnect metal, suffers from several drawbacks such as relatively high electrical resistivity and susceptibility to electromigration which may curtail its usefulness. Other metallization materials, such as tungsten and molybdenum, provide a high migration resistance but also have a high electrical resistance that prevents an integrated circuit incorporating these materials from being operated at high speed. Because of its low resistivity and enhanced resistance to electromigration, copper is an attractive material for high-speed integrated circuits. Still other candidates being considered for use as a metallization material include platinum, cobalt, nickel, palladium, ruthenium, rhodium, iridium, gold, silver and alloys comprising same.

Numerous methods such as ionized metal plasma (IMP), physical vapor deposition (PVD), chemical vapor deposition (CVD), atomic layer deposition (ALD), plasma-assisted chemical vapor deposition (PACVD), plasma-enhanced chemical vapor deposition (PECVD), electroplating, and electroless plating have been used to deposit a metal film such as copper upon a barrier layer. Among them, CVD and ALD methods using one or more organometallic precursors may be the most promising methods because these methods provide excellent step coverage for high aspect ratio structures and good via filling characteristics.

Several organometallic precursors have been developed to deposit low electrical resistivity copper films by the aforementioned processes, particularly CVD or ALD processes. Two of the most useful families of copper CVD precursors that have been studied extensively are the Cu (I) and Cu (II) β-diketonates. The Cu (II) precursors require use of an external reducing agent such as hydrogen or alcohol to deposit copper films that are largely free of impurities, while Cu (I) precursors can deposit pure copper films without using an external reducing agent via a bimolecular disproportionation reaction that produces a Cu (II) β-diketonate as a volatile byproduct. The β-diketonate ligand most often present in these precursors is hexafluoroacetylacetonate or the hfac anion $[OC(CF_3)CHC(CF_3)O]^-$. A particularly effective CVD copper precursor is 1,1,1,5,5,5-hexafluoro-2,4-pentanedionato-copper (I) trimethylvinylsilane (hereinafter Cu(hfac)(t-mvs)), which is sold under the trademark CUPRASELECT™ by the Schumacher unit of Air Products and Chemicals, Inc., Carlsbad, Calif., the assignee of the present invention.

A barrier layer is typically utilized in conjunction with a metal or copper layer to prevent detrimental effects caused by the interaction or diffusion of the metal or copper layer with other portions of the integrated circuit. Exemplary barrier materials include metals, such as titanium, tantalum, tungsten, chromium, molybdenum, zirconium, vanadium, and carbides, nitrides, carbonitrides, silicon carbides, silicon nitrides, and silicon carbonitrides of these metals where they constitute a stable composition. In some instances, the initial deposition of CVD or ALD metal or copper film on the barrier layer may function as a seed layer, e.g., an adhesive, conducting seed layer to facilitate further deposition of a subsequent metal layer such as copper by electrochemical plating, electroless plating, or by PVD, CVD, or ALD methods to complete the thin-film interconnect.

Despite the foregoing developments, the integrated circuit (IC) industry is presently experiencing difficulty forming adherent metal or copper films on diffusion barrier layer materials. A variety of solutions to this problem have been proposed. For example, Gandikota et al., Microelectronic Engineering 50, 547-53 (2000), purports to improve adhesion between a CVD copper thin film and barrier layers by: (a) depositing a copper flash layer on the barrier layer by physical vapor deposition (PVD) prior to chemical vapor deposition, or (b) annealing the CVD copper layer after deposition. See also Voss et al., Microelectronics Engineering 50, 501-08 (2000). Unfortunately, these methods are not acceptable to the IC industry because they add to the equipment requirements for the copper deposition step. In addition, annealing, particularly at elevated temperatures, can have deleterious effects on the overall product.

U.S. Pat. No. 5,019,531 discloses a CVD process for depositing copper on a substrate selected from the group consisting of aluminum, silicon, titanium, tungsten, chromium, molybdenum, zirconium, tantalum, vanadium and silicides thereof using an organic complex or organometallic compound of copper. The organic complex or organometallic compound is selected from β-diketonate and cyclopentadienyl compounds of copper such as bis-acetylacetonato-copper, bis-hexafluoroacetylacetonato-copper, bis-dipivaloylmethanato-cooper, dimethyl-gold-hexafluoroacetylacetonato, cyclopentadienyl-triethylphosphine-copper, and dimethyl-gold-acetylacetonato. The adhesion of the copper on the substrate, however, was poor.

As mentioned previously, one method to form a copper film unto a substrate having a barrier layer deposited thereupon is through plasma enhanced or plasma assisted chemical vapor deposition. The reference, Eisenbraun et al., "Enhanced Growth of Device-Quality Copper by Hydrogen Plasma-Assisted Chemical Vapor Deposition" published in Appl. Phys. Letter, 1992), describes a PACVD process for depositing copper using β-diketonate precursors. According to Eisenbraun, the copper precursor is reduced by atomic and ionic hydrogen species to deposit copper on the substrate. The reference, Jin et al., Plasma-Enhanced Metal Organic Chemical Vapor Deposition of High Purity Copper Thin Films Using Plasma Reactor with the H Atom Source" published in J. Vac. Sci. Technology A, 1999, also discloses a plasma-enhanced technique to deposit pure copper using Cu(II) bis(hexafluoroacetylacetonato), Cu(II)(hfac), as an organometallic precursor. Likewise, the reference, Laksmanan et al., "A Novel Model of Hydrogen Plasma Assisted Chemical Vapor Deposition of Copper" and published in Thin Solid Films, 1999, describes a hydrogen-plasma assisted process for depositing copper on a barrier layer. Although, the aforementioned references were successful in depositing a metallic, continuous, dense device-quality copper film with conformal step coverage that was virtually free from heavy element contaminants, the adhesion of copper on the substrate was unacceptable.

U.S. Pat. Nos. 5,085,731, 5,094,701 and 5,098,516 (referred to collectively as Norman) describe a thermal CVD process for depositing a copper film with low electrical resistivity by using a volatile liquid organometallic copper precursor such as Cu(hfac)(tmvs) at relatively low temperatures onto metallic substrates. Further, the reference, Norman et al. "Chemical Additives for Improved Copper Chemical Vapor Deposition Processing", Thin Solid Films, 1995, describes the use of tmvs and hfac ligands alone or in combination with water to improve deposition of copper. This deposition was achieved, however, with limited success. Numerous other researchers investigated the use of tmvs and hfac ligands alone or in combination with water to improve deposition of copper with limited or no success (e.g., Petersen et al. "Enhanced Chemical vapor Deposition of Copper from (hfac)Cu(TMVS) Using Liquid Coinjection of TMVS", J. Electrochem. Soc., 1995; Gelatos et al. "Chemical Vapor Deposition of Copper from $Cu^{+1}$ Precursors in the Presence of Water Vapor" Appl. Phys. Letter, 1993; Japanese Unexamined Patent Publication JP 2000-219968A; and U.S. Pat. No. 6,165,555).

Other organometallic copper precursors, such as (hfac)Cu (I)(MP) where MP is 4-methyl-1-pentene and (hfac)Cu(I) (DMB) where DMB is 3,3-dimethyl-1-butene, have been used to deposit low resistivity copper films on silicon wafers coated with titanium nitride (Kang et al., "Chemical Vapor Deposition of Copper Film", Thin Solid Films, 1999). In the reference, Hwang et al., "Surfactant-Catalyzed Chemical Vapor Deposition of Copper Thin Films", Chem. Mater., 2000, a submonolayer of iodine has been used to facilitate deposition of copper films from Cu(hfac)(tmvs) with a smooth surface and at a greatly enhanced rate. None of these techniques, however, discusses the quality of the CVD deposited copper film on the barrier layer.

U.S. Pat. No. 6,423,201 B1 describes the use of a thin silicon layer at the top of a TiN barrier layer to improve adhesion. It is, however, not desirable to deposit copper directly on silicon due to the formation of copper silicon alloys which exhibit high resistivity.

The adhesion of copper to the underlying barrier materials has also been reported to be problematic by several researchers. For example, the deposition of copper on titanium nitride substrate using Cu(I)(hfac)(tmvs) precursor (or CUPRASELECT™) has been reported to be poor (Nguyen, T. and Evans, D. R., "Stress and Adhesion of CVD Copper and TiN", Mat. Res. Soc. Symp. Proc., 1995 and Nguyen, T. and Evans, D. R., "Stress and Adhesion of CVD Copper and TiN", Mat. Res. Soc. Symp. Proceeding, 1995). It has been reported that the direct deposition of CVD copper on a diffusion barrier leads to the formation of a fluorine, carbon and oxygen containing amorphous layer between the copper film and barrier layer that is responsible for poor adhesion, as discussed by Kroger, R. et al. in papers "Nucleation and Growth of CVD Copper Films" published in Mat. Res. Soc. Symp. Proceeding, 1999 and "Properties of Copper Films Prepared by Chemical Vapor Deposition for Advanced Metallization of Microelectronic Devices" published in J. Electrochemical Society, 1999. The amorphous layer is believed to be formed during very early stages of CVD copper deposition from the by-products of the Cu (I) precursor. Similar adhesion problems on barrier layer have been reported with Cu (II) precursors.

The reference WO 00/71550 discusses limiting the formation of a fluorine, carbon and oxygen containing amorphous layer on the barrier layer by reducing and/or eliminating the amount of fluorine present in the copper precursors. However, these attempts have not yet resulted in the desired results.

Reduction of copper precursors like Cu (II) bis-(2,2,6,6-tetramethyl-3,5-heptanedionate) with hydrogen and Cu (II) bis-(1,1,1,5,5,5-hexafluoroacetylactonate) hydrate with methanol, ethanol, and formalin have been tried to deposit copper by atomic layer epitaxy on a variety of barrier layers with limited success, as described by Martensson and Carlsson in "Atomic Layer Epitaxy of Copper", J. Electrochem. Soc., 2000 and Solanki and Pathangey in "Atomic Layer Deposition of Copper Seed Layers", Electrochemical and Solid-State Letters, 2000.

The reference, Holloway et al. in a paper "Tantalum as a Diffusion Barrier Between Copper and Silicon: Failure Mechanism and Effect of Nitrogen Additions" published in J. Appl. Physics, 1992, relates that tantalum nitride ($Ta_2N$) is an excellent barrier to copper penetration. However, the reference fails to discuss the deposition of copper by CVD on tantalum nitride nor the quality of CVD copper adhesion onto the tantalum nitride.

The barrier properties of CVD and sputtered tantalum nitride have been studied and compared by Tsai et al. in a paper "Comparison of the Diffusion Barrier Properties of Chemical-Vapor Deposited and Sputtered TaN between Cu and Si" published in J. Appl. Physics, 1996. However, the reference fails to discuss the deposition of copper by CVD on tantalum nitride nor the quality of CVD copper adhesion onto the tantalum nitride.

Despite the foregoing developments, there remains a need to develop a process to improve the adhesion of a metal, particularly a copper, film deposited on a diffusion barrier layer by CVD or ALD. Further, there is a need for a process to improve the adhesion of the metal film onto the barrier layer without incurring additional equipment requirements or an annealing step.

All references cited herein are incorporated herein by reference in their entireties.

BRIEF SUMMARY OF THE INVENTION

The present invention satisfies one, if not all, of the needs in the art by providing a method for forming a metal layer, preferably a copper film, onto at least a portion of the surface of a substrate having a diffusion barrier layer deposited thereupon. Specifically, in one aspect of the present invention, there is provided a process for forming a metal film on a surface of a diffusion barrier layer comprising: providing at least one surface of the diffusion barrier layer wherein the diffusion barrier layer is comprised of at least one material selected from the group consisting of a metal, a metal carbide, a metal nitride, a metal carbonitride, a metal silicon carbide, a metal silicon nitride, a metal silicon carbonitride, or a mixture thereof and wherein the at least one surface is substantially free of an elemental metal; and forming the metal film on at least one surface using at least one organometallic precursor provided that when the diffusion barrier layer (i) has a material that is the metal, (ii) has an orientation other than a preferred (111) orientation, and/or (iii) has less than 95% preferred (111) orientation; then the step of exposing at least one surface of the diffusion barrier layer to at least one adhesion promoting agent selected from the group consisting of a nitrogen, a nitrogen-containing compound, a carbon-containing compound, a carbon and nitrogen containing compound, a silicon-containing compound, a silicon and carbon containing compound, a silicon, carbon, and nitrogen containing compound or a mixture thereof is conducted.

In another aspect of the present invention, there is provided a process for forming a substantially continuous copper film on a surface of a diffusion barrier layer comprising: providing a substrate comprising a diffusion barrier layer wherein the diffusion barrier layer is comprised of at least one material selected from the group consisting of a metal, a metal carbide, a metal nitride, a metal carbonitride, a metal silicon carbide, a metal silicon nitride, a metal silicon carbonitride, or a mixture thereof; exposing the surface of the diffusion barrier layer to an adhesion promoting agent selected from the group consisting of nitrogen, a nitrogen-containing compound, a carbon-containing compound, a carbon and nitrogen containing compound, a silicon-containing compound, a silicon and carbon containing compound, a silicon, carbon, and nitrogen containing compound, or mixtures thereof; and forming the copper film on the at least a portion of the surface via the deposition with an organometallic copper precursor.

In another aspect of the present invention, there is provided a process for forming a substantially continuous metal film on a surface of a diffusion barrier layer comprising: providing a substrate comprising a diffusion barrier layer wherein the diffusion barrier layer is comprised of at least one material selected from the group consisting of a metal carbide, a metal nitride, a metal carbonitride, a metal silicon carbide, a metal silicon nitride, a metal silicon carbonitride, or a mixture thereof and wherein the diffusion barrier layer comprises a substantially (111) preferred orientation and forming the metal film on the surface of the diffusion barrier layer via the deposition with an organometallic precursor.

In yet another aspect of the present invention, there is provided a process for forming a substantially continuous metal film on a surface of a diffusion barrier layer comprising: providing a substrate comprising a diffusion barrier layer wherein the diffusion barrier layer is comprised of at least one material selected from the group consisting of a metal, a metal carbide, a metal nitride, a metal carbonitride, a metal silicon carbide, a metal silicon nitride, a metal silicon carbonitride, or a mixture thereof; exposing the surface of the diffusion barrier layer to an adhesion promoting agent selected from the group consisting of nitrogen, a nitrogen-containing compound, a carbon-containing compound, a carbon and nitrogen containing compound, a silicon-containing compound, a silicon and carbon containing compound, a silicon, carbon, and nitrogen containing compound, or mixtures thereof; and growing a metal film on the surface of a the diffusion barrier layer by contacting the surface with a halogen-containing precursor and an organometallic precursor wherein the halogen and the metal within the precursors react to form a metal halide layer; and exposing the metal halide layer to a reducing agent to provide the metal film.

In another aspect of the present invention, there is provided a process for forming a substantially continuous metal layer on an at least one surface of a diffusion barrier layer, the process comprising: providing a substrate comprising the diffusion barrier layer within a vacuum chamber wherein at least one exposed surface of the diffusion barrier layer is substantially free of an elemental metal; introducing an at least one organometallic precursor into the vacuum chamber; and applying energy to the at least one organometallic precursor to induce reaction of the organometallic precursor to deposit the substantially continuous metal layer on the at least one surface of the diffusion barrier layer.

These and other aspects of the present invention will be more apparent from the following description.

DETAILED DESCRIPTION OF THE INVENTION

The present invention provides a method for depositing a metal film on a substrate surface having a diffusion barrier layer wherein the metal film is deposited on the barrier layer by the chemical vapor deposition or atomic layer deposition with an organometallic precursor. The resultant metal film may have an increased adherence to the underlying barrier layer. The prior art has disclosed a variety of methods for depositing metal films, such as copper films, onto surfaces of a substrates and/or barrier layers using an organometallic precursors, particularly fluorinated precursors. The resultant films of the prior art, unfortunately, have relatively poor adherence to the underlying diffusion barrier layer.

The problem of poor adherence of the metal film onto the diffusion barrier layer may be attributable to the presence of $CF_3$ radicals on the barrier layer when a fluorinated organometallic precursor is used to deposit the metal layer. In embodiments wherein a copper film is deposited, the deposition of the diffusion barrier layer and the copper layer is generally conducted in a cluster tool equipped with a number of chambers operated under vacuum. The barrier layer can be deposited onto a substrate such as a silicon wafer either by CVD, ALD, or PVD in one chamber and then transferred to another chamber for the deposition of the copper film. Because of the use of the organometallic copper precursor in the chamber for prior depositions of copper, the chamber may be contaminated with fragments or dissociated species of the organometallic copper precursor such as $CF_3$ radicals. The $CF_3$ radicals may react with the exposed metal in the barrier layer, leading to the formation of a fluorine, carbon and oxygen containing amorphous layer between the copper film and the barrier layer. The formation of this amorphous layer may thereby compromise the adhesion between these two layers.

As mentioned previously, one particularly preferred fluorinated organometallic copper precursor is Cu(I)(hfac)(tmvs). While not intending to be bound by theory, there are believed to be two mechanisms involved when depositing copper using Cu(I)(hfac)(tmvs). The first mechanism may be a simple disproportianation reaction wherein copper is deposited on a substrate that is not chemically active towards degrading the precursor without breaking the C—$CF_3$ bonds contained in the 'hfac' ligand. The product from the disproportionation reaction such as Cu(II)(hfac)$_2$ may be volatile in nature and can be removed from the chamber without further disintegration leaving elemental Cu to be deposited onto the substrate surface. The second mechanism, however, which is encountered when the precursor is introduced to a barrier material such as tantalum which is chemically reactive, involves the breakdown of the C—$CF_3$ bonds in the Cu(I)(hfac)(tmvs) molecule. This process may produce fragments such as $CF_3$ radicals that are extremely reactive thereby causing the formation of an undesirable amorphous layer of chemical debris on the barrier layer. Consequently, it may be desirable to avoid the breakdown of Cu(I)(hfac)(tmvs) molecule during the deposition process. Alternatively, it may be desirable to make the barrier layer non-reactive to the fragments or dissociated species of the Cu(I)(hfac)(tmvs) molecule to deposit the copper film on at least a portion of the barrier layer with improved adhesion. While the previous example discusses depositing copper films with a organometallic copper precursor, it is believed that the method of the present invention is applicable to the deposition of other metal films besides copper such as platinum, nickel, cobalt, palladium, ruthenium, rhodium, irridium, gold and silver, etc. with organometallic precursors such as organometallic platinum precursors, organometallic nickel precursors, organometallic cobalt precursors, organometallic palladium precursors, organometallic ruthernium precursors, organometallic iridium precursors, organometallic gold precursors, organometallic silver, etc.

One attempt to render the surface of the barrier layer non-reactive to the dissociated species of the organometallic precursor is by the deposition of a thin, flash layer of metal onto the barrier layer using a physical vapor deposition technique such as sputtering. The thin layer of metal may be chemically inert towards the dissociated species of the organometallic precursor thereby preventing the formation of a fluorine, carbon and oxygen containing amorphous layer on the metal film. Unfortunately, the addition of an additional chamber to a production line to deposit a flash layer of metal may be prohibitively expensive. Further, the flash layer of metal is an incomplete solution to the adherence problem because the flash layer resides primarily at the base of deeply etched features such as vias or lines. The sidewalls of these features are still exposed to the organometallic precursor in subsequent processing steps. Therefore, the key to achieving adhesion between the metal and barrier layer is to render the barrier layer substantially unreactive towards the dissociated species of the organometallic precursor.

The present invention provides a method to improve the adhesion of a metal film, preferably a copper film, upon at least a portion of the barrier layer by providing at least a portion of the barrier layer that may be substantially non-reactive to the fragments of the dissociated organometallic precursor molecule. Further, in some embodiments, the breakdown of the organometallic precursor into dissociated species may be avoided. It is thus surprising and unexpected that the deposition of a substantially continuous metal film onto at least a portion of the barrier layer having relatively good adhesion may be achieved by avoiding exposure of an elemental metal present on the surface of the barrier layer to the organometallic precursor and/or any dissociated fragments of the organometallic precursor. In this connection, at least a portion of the barrier layer surface may be substantially free of an elemental metal. A substantially metal-free barrier layer surface may be achieved through: (a) providing a metal nitride, metal carbide, metal carbonitride, metal silicon carbide, metal silicon nitride, metal silicon carbonitride barrier layer with a substantially (111) preferred orientation (i.e., at least 95% or greater (111) preferred orientation); (b) exposing a metal nitride, metal carbide, metal carbonitride, metal silicon carbide, a metal silicon nitride, or a metal silicon carbonitride barrier layer with a (111) preferred orientation below 95% to an adhesion promoting agent prior to the formation of the metal layer; (c) exposing a surface of the metal nitride, metal carbide, metal carbonitride, a metal silicon carbide, a metal silicon nitride, or a metal silicon carbonitride barrier layer with an orientation other than a (111) preferred orientation with an adhesion promoting agent prior to the formation of the metal layer; and (d) exposing the surface of a metal barrier layer to an adhesion promoting agent prior to the formation of the metal layer. Examples of orientations other than a (111) preferred orientation include, but are not limited to, a (100) preferred orientation, a (200) preferred orientation, or an amorphous layer. The adhesion promoting agent may be at least one agent selected from the group consisting of nitrogen, nitrogen-containing compounds such as ammonia, carbon-containing compounds such as methane, ethane, propane, ethylene, acetylene, propylene, etc., carbon and nitrogen containing compounds such as amines, silicon-containing compounds such as silane and disilane, silicon and carbon containing compounds such as methyl silane, dimethyl silane, trimethyl silane, etc., and silicon, carbon, and nitrogen containing compounds such as trimethylsilylcyanide, 1-trimethylsilylimidazole, etc., or mixtures thereof. Avoiding the presentation on the exposed metal in the surface of the barrier layer to the organometallic precursor, particularly dissociated species of an organometallic precursor, can minimize or eliminate the formation of the undesirable amorphous layer thereby resolving the adhesion problem.

The diffusion barrier layer of the present invention may be comprised of a material such as a metal, a metal carbide, a metal nitride, a metal carbonitride, a metal silicon nitride, a metal silicon carbide, a metal silicon carbonitride, or a mixture thereof. Exemplary metals suitable for use in the present invention include titanium, tungsten, chromium, tantalum, molybdenum, zirconium, vanadium, or mixtures thereof. Some exemplary metal carbides include titanium carbide, tungsten carbide, tantalum carbide, chromium carbide, molybdenum carbide, vanadium carbide, zirconium carbide, or mixtures thereof. Exemplary metal nitrides include, but are not limited to, titanium nitride, tungsten nitride, tantalum nitride, chromium nitride, molybdenum nitride, zirconium nitride, vanadium nitride, or mixtures thereof. Exemplary metal carbonitrides include titanium carbonitride (TiCN), tantalum carbonitride (TaCN), chromium carbonitride, tungsten carbonitride, molybdenum carbonitride, zirconium carbonitrides, or mixtures thereof. Exemplary metal silicon nitrides include titanium silicon nitride (TiSiN), molybdenum silicon nitride (MoSiN), etc. Exemplary metal silicon carbides include titanium silicon carbide (TiSiC), tungsten silicon carbide (WSiC), etc. Exemplary metal silicon carbonitrides include silicon carbonitride, titanium silicon carbonitride, and tantalum silicon carbonitride, etc. In certain embodiments of the present invention wherein the diffusion barrier layer is comprised of a material other than a pure metal (i.e., metal carbide, metal nitride, metal carbonitride, metal silicon carbide, metal silicon nitride, or metal silicon carbonitride), the surface of the barrier layer may have a substantially (111) preferred orientation, i.e., has 95% or greater (111) preferred orientation, to avoid the need for the additional step of exposing the surface to an adhesion promoting agent. In these embodiments, at least a portion of the diffusion barrier surface may also be substantially pure, i.e., have a material purity of 95% or greater.

The diffusion barrier layer can be deposited by a variety of processes such as, but not limited to, chemical vapor deposition (CVD), atomic layer deposition (ALD), or physical vapor deposition (PVD) processes. Some examples of CVD processes that may be used to form the barrier layer include the following: thermal chemical vapor deposition, plasma enhanced chemical vapor deposition ("PECVD"), high density PECVD, photon assisted CVD, plasma-photon assisted ("PPACVD"), cryogenic chemical vapor deposition, chemical assisted vapor deposition, hot-filament chemical vapor deposition, photo initiated chemical vapor deposition, CVD of a liquid polymer precursor, deposition using supercritical fluids, or transport polymerization ("TP"). These processes may be used alone or in combination. In certain preferred embodiments, the deposition of the barrier layer is conducted at a temperature ranging from 100 to 425° C., preferably from 150 to 400° C. In certain other preferred embodiments, the deposition is conducted under vacuum at a pressure ranging from $10^{-9}$ torr to 400 torr, preferably from 1 millitorr to 100 torr. Although the chemical reagents used herein may be sometimes described as "gaseous", it is understood that the chemical reagents may be delivered directly as a gas to the reactor, delivered as a vaporized liquid, a sublimed solid and/or transported by an inert carrier gas into the reactor. A reducing gas such as hydrogen can optionally be used during the deposition of the barrier layer.

In certain embodiments, PVD processes, such as sputtering, reactive sputtering, etc. may be used to deposit metal nitride, metal carbide, metal carbonitride, metal silicon nitride, metal silicon carbide, or metal silicon carbonitride barrier layers with and without a (111) preferred orientation. The extent of metal nitride, metal carbide, or metal carbonitride material with (111) preferred orientation present in the film can be adjusted by manipulating deposition parameters including the sputtering rate, the applied power and bias, the partial pressure of reactive gas such as nitrogen, ammonia or a hydrocarbon gas, the deposition temperature and pressure, etc. If the barrier layer does not have a substantially (111) preferred orientation, the barrier layer can be exposed to an adhesion promoting agent such as any of the agents disclosed herein prior to depositing the metal by CVD or ALD processes. The exposure to an adhesion promoting agent is preferably conducted at a temperature and pressure similar to that used to deposit the metal nitride, metal carbide, metal carbonitride, metal silicon nitride, metal silicon carbide, or metal silicon carbonitride diffusion barrier layer.

A tantalum nitride barrier layer can be deposited by a PVD (or sputtering) process, such as that described in International patent Application WO 99/53114 and by Mehrotra in a paper "Properties of Direct Current Magnetron Reactively Sputtered TaN" published in J. Vac. Sci. Technology, 1987. If the PVD (or sputtered) TaN does not contain TaN with a substantially (111) preferred orientation, the film may be exposed to an adhesion promoting agent such as nitrogen or plasma activated nitrogen, or any of the other adhesion promoting agents disclosed herein, prior to forming the metal layer.

A tungsten nitride barrier layer can be deposited by a CVD process, such as that described in International patent Application WO 99/00830. If the CVD deposited WN barrier layer does not contain WN with a substantially (111) preferred orientation, the film may be exposed to an adhesion promoting agent such as nitrogen or plasma activated nitrogen, or any of the other adhesion promoting agents disclosed herein, prior to forming the metal layer.

A titanium nitride barrier layer can be deposited by a PVD (or sputtering) process, such as that described, for example, in Japanese Patent Application 96127870 and U.S. Pat. Nos. 5,521,120; 5,242,860; and 5,434,044. The titanium nitride barrier layer may also be deposited by a sputtering process such as that described by Chen et al. in a paper "Evaluation of Radio-Frequency Sputtered-Deposited Textured TiN Thin Films as diffusion Barriers between Copper and Silicon" published in J. Vac. Sci. Technology, 2002 and by Li in a paper "Initial Growth and Texture Formation During Reactive Magnetron Sputtering of TiN on Si(111)" published in J. Vac. Sci. Technology, 2002. If the PVD (or sputtered) TiN does not contain TiN with a substantially (111) preferred orientation, the film may be exposed to an adhesion promoting agent such as nitrogen or plasma activated nitrogen, or any of the other adhesion promoting agents disclosed herein, prior to forming the metal layer.

A titanium nitride barrier layer can be deposited by a CVD process such as that described, for example, by Weiller in a paper "CVD of Titanium Nitride for Electronic Applications: Gas Phase Chemical Kinetics for Fundamental Principles and Modeling" published in Electrochemical Society Proceedings, 1996, by Buiting et al. in a paper "Kinetical Aspects of the LPCVD of Titanium Nitride from Titanium Tetrachloride and Ammonia" published in J. Electrochem. Society, 1991, and by Bouteville in a paper "Low Temperature Rapid Thermal Low Pressure Chemical Vapor Deposition of (111) Oriented TiN Layers from the $TiCl_4$—$NH_3$—$H_2$ Gaseous Phase" published in Microelectronic Engineering, 1997. If the CVD deposited TiN does not grow with a substantially (111) preferred orientation, the film may be exposed to an adhesion promoting agent such as nitrogen or plasma activated nitrogen, or any of the other adhesion promoting agents disclosed herein, prior to forming the metal layer.

In embodiments wherein the barrier layer is exposed to an adhesion promoting agent, the exposure may occur prior to or during at least a portion (preferably the initial portion) of the formation of the metal film. The temperature of the exposure step is preferably about 40 to about 400° C., more preferably 100 to 400° C. The duration of the exposure step is preferably about 0.1 to about 10 minutes, more preferably 0.1 to 2 minutes. The pressure during exposure is preferably about $10^{-9}$ torr to 400 torr, more preferably 1 millitorr to 100 torr.

As mentioned previously, at least one organometallic precursor is used to form the metal or copper film using a CVD or an ALD process. The organometallic precursor may be used by itself or in a mixture with other organometallic compounds depending upon the composition of the metal film to be deposited. Exemplary organometallic precursor compounds include organometallic copper precursors, organometallic platinum precursors, organometallic nickel precursors, organometallic cobalt precursors, organometallic palladium precursors, etc.

In certain embodiments of the present invention, the organometallic precursor may be a non-fluorinated organometallic compound such as the compound represented by the structure (I):

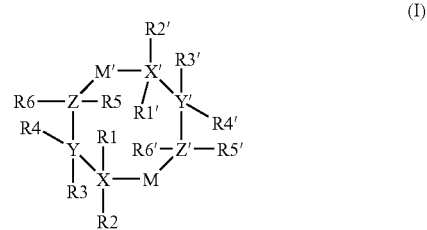

(I)

In structure (I), M and M' are each a metal such as Cu, Ag, Au, and Ir; X and X' can be N or O; Y and Y' can be Si, C; Sn, Ge, B or Al; and Z and Z' can be C, N, or O. Substituents represented by R1, R2, R3, R4, R5, R6, R1', R2', R3', R4', R5', and R6' will vary depending on the ring atom to which they are attached. In one embodiment of the present invention wherein a copper film is formed M and M' are each Cu; X and X' are each N; Y and Y' are each Si; Z and Z' are each C; R1, R2, R1', and R2' are each independently an alkyl, an alkenyl, an alkynyl, a partially fluorinated alkyl, an aryl, an alkyl-substituted aryl, a partially fluorinated aryl, a fluoroalkyl-substituted aryl, a trialkylsilyl, or a triarylsilyl; R3, R4, R3', and R4' are each independently an alkyl, a partially fluorinated alkyl, a trialkylsilyl, a triarylsilyl, a trialkylsiloxy, a triarylsiloxy, an aryl, an alkyl-substituted aryl, a partially fluorinated aryl, a fluoroalkyl-substituted aryl, or an alkoxy; and R5, R6, R5', and R6' are each independently a hydrogen, an alkyl, an alkenyl, an alkynl, a partially fluorinated alkyl, an aryl, an alkyl-substituted aryl, a partially fluorinated aryl, a fluoralkyl-substituted aryl, a trialkylsilyl, a triarylsilyl, a trialkylsiloxy, triarylsiloxy, an alkoxy, a SiR7R8N(R9R10) group, or a SiR7R8OR11 group wherein R7, R8, R9, R10, and R11 can be an alkyl; and the alkyl and alkoxide groups have from 1 to 8 carbons, the alkenyl and the alkynyl groups have from 2 to 8 carbons; and the aryl group has 6 carbons. Additional examples of non-fluorinated organometallic precursors suitable for use with the present invention are provided in pending U.S. patent application Ser. No. 10/323,480 and U.S. Pat.

Application, Atty. Docket No. 06414USA filed Apr. 22, 2003, which are presently assigned to the assignee of the present invention.

In certain preferred embodiments of the present invention, at least one organometallic copper precursor is used to form a copper film. The organometallic copper precursor may be fluorinated or non-fluorinated. Examples of fluorinated compounds include, but are not limited to, compounds comprising hexafluoroacetylacetonate, most preferably Cu(I)(hfac)(tmvs). Examples of non-fluorinated organometallic copper precursors include, but are not limited to, copper bis (acetylacetanoate), copper bis(2-dimethylaminoethoxide), and tetra(copper tert-butoxide).

The organometallic precursor may be added to the deposition chamber as a mixture with other materials. Such materials include carrier gases which may be employed in transporting the gaseous phase precursors to the reaction chamber for lesser volatile precursors and enhance or otherwise control the deposition rate. Examples of other compounds that can be added to the deposition chamber include, but are not limited to, $H_2O$, tmvs, $H_2$, Ar, He, Kr, or Xe. The metal film of the present invention may be deposited using any of the ALD or CVD processes disclosed herein. Processes of the invention are preferably conducted at ambient pressure or less, more preferably at a pressure of about $10^{-9}$ torr to 400 torr. Processes of the invention can be conducted at temperatures below room temperature and at temperatures typically achieved during deposition of barrier layers. Preferably, the processes are conducted at temperatures ranging from 50 to 400° C.

In one embodiment of the present invention, the metal film is formed by an ALD process. An example of an ALD process suitable for use with the present invention is provided in pending U.S. patent application Ser. No. 10/324,781. A metal film is deposited upon a substrate surface with the desired diffusion barrier layer from at least two precursors: a halogen-containing precursor and a metal-containing precursor. Examples of suitable halogen-containing precursors include, but are not limited to, halogen-containing silanes; alkylchlorosilanes, alkylbromosilanes, or alkyliodosilanes; silicon halide compounds such as silicon tetrachloride, silicon tetrabromide, or silicon tetraiodide; halogenated tin compounds such as alkylchlorostannanes, alkylbromostannanes, or alkyliodostannanes; germane compounds such as alkylchlorogermanes, alkylbromogermanes, or alkyliodiogermanes; boron trihalide compounds such as borontrichloride, boron tribromide, or boron triodide; aluminum halide compounds such as aluminum chloride, aluminum bromide, or aluminum iodide; alkylaluminum halides; gallium halide compounds such as gallium trichloride, gallium tribromide, or gallium triodide; or combinations thereof. Examples of suitable metal-containing precursors include any of the organometallic precursors disclosed herein. A metal halide layer is grown by sequentially introducing the halogen-containing precursor and a metal-containing precursor into the process chamber. The metal halide layer is then exposed to a reducing agent such as, but not limited to, hydrogen gas, remote hydrogen plasma, silanes, boranes, alanes, germanes, hydrazines, or mixtures thereof.

Thin films may exhibit a range of atomic order from amorphous to highly crystalline. A crystalline thin film may form as one single crystal with a specific crystallographic orientation relative to the substrate, or as an aggregate of crystals, with random or non-random orientations. XRD is capable of distinguishing highly oriented single crystals or polycrystalline films from polycrystalline films with random orientation. It has been shown that a metal film such as a copper film having (111) as the dominant texture or orientation is preferable because of its resistance to electromigration. Furthermore, it is widely accepted that a copper film deposited via a CVD process tends to form with a preference for a (200) orientation on the most commonly utilized barrier layers, such as tantalum, while copper deposited via a sputtering process on the same barrier layer tends to orient with a preference for a (111) texture which helps to enhance the electrical properties of the copper. The invention described herein not only improves the adhesion of copper but also promotes the growth of copper as well as other metal films with a preference for a (111) orientation if deposited onto a (111) oriented barrier layer.

The metal film of the present invention may be a substantially continuous film, preferably having a thickness of at least 5 angstroms, more preferably from 5 to 6000 angstroms. In certain embodiments of the present invention, the metal or copper film may be used as an interfacial layer and/or a seed layer at the top of the barrier layer.

The invention will be illustrated in more detail with reference to the following Examples, but it should be understood that the present invention is not deemed to be limited thereto. In this connection, while the examples simulate the CVD deposition of a copper film using, it is understood that the present invention is suitable for deposition of other metal films using organometallic precursors besides organometallic copper precursors by CVD or ALD processes.

EXAMPLES

For the following examples, a number of theoretical calculations were performed based on periodic quantum mechanical density function theory under the generalized gradient approximation to study reactivity of a CUPRASELECT™ organometallic copper precursor with a variety of different diffusion barrier layers such as tantalum, tantalum nitride with (100) preferred orientation, tantalum nitride with a substantially (111) preferred orientation, tungsten, and tungsten nitride with a substantially (111) preferred orientation. A series of ab initio molecular dynamic simulations using different barrier layers was performing using the computer software program entitled "Siesta" developed by Sanchez-Portal, Ordejon, et al. (Refs. D. Sanchez-Protal, P. Ordejon, E. Artacho, and J. M. Soler, Int. J. Quantum Chem. 65, 453 (1997); J. M. Soler, E. Artacho, J. D. Gale, A. Garcia, J. Junquera, P. Ordejon, and D. Sanchez-Portal, J. Phys. Condens. Matter 14, 2745 (2002). Surface reactions including copper deposition were directly simulated. The simulation methods were entirely base on physical first principles without using empirical or experimental parameters and have been widely shown to be capable of providing accurate thermodynamic and kinetic data for a wide range of materials.

For the following examples, the structure of the Cu(I)(hfac)(tmvs) or CUPRASELECT™ molecule used was as follows:

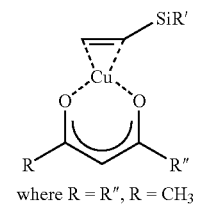

where R = R″, R = $CH_3$

The tantalum or tungsten barrier layer was simulated by using 3 atomic layers of tantalum; whereas, the tantalum or tungsten nitride layer was simulated by using 3 atomic layers of tantalum and 3 atomic layers of nitrogen.

Example 1

Copper Deposited by CUPRASELECT™ Upon Tantalum Metal Barrier Layer Having (100) Preferred Orientation An ab initio molecular dynamic computer simulation, based on periodic density function theory, was used to study the interaction between CUPRASELECT™ and a tantalum metal surface with a (100) preferred orientation. The simulation was performed at room temperature (25° C.) and near the CVD copper deposition temperature of 200° C. The theoretical results predicted that the CUPRASELECT™ molecule decomposed spontaneously upon exposure to a tantalum metal layer and formed tantalum carbides, oxides, and fluorides. The results also predicted that the C—$CF_3$ bond in the 'hfac' ligand was the weakest bond within the molecule and can be easily broken into $CF_3$ groups. The energy required to break the C—$CF_3$ bond is ~39 kcal/mol, which was considerably lower than the exothermic energy (~260 kcal/mol) involved in the chemisorption of $CF_3$ on the tantalum metal surface. This highly exothermic energy would be responsible for the further decomposition of $CF_3$ into fragments. Rather than volatilizing and escaping the deposition chamber, the fragments react with the tantalum surface, thereby forming a fluorine, carbon and oxygen containing amorphous layer on the barrier layer. This amorphous layer may lower the adherence of a copper layer when deposited onto the tantalum metal barrier layer.

Due to the formation of the amorphous layer, the present example illustrates that it may be difficult, if not impossible, to deposit copper adherently on tantalum metal by conventional CVD or ALD processes. The example also illustrates that the exothermic energy involved in chemisorption of the $CF_3$ radical on a barrier layer could be used indirectly to evaluate the interaction between the CUPRASELECT™ molecule and the barrier layer and the adhesion of copper on the barrier layer in subsequent examples. A high exothermic chemisorption energy resulting in fragmentation of the $CF_3$ radical would indicate poor adhesion of the copper deposited by CUPRASELECT™ on a barrier layer.

Example 2

Copper Deposited by CUPRASELECT™ Upon Tantalum Nitride Barrier Layer Having (100) Orientation A computer simulation program applying the periodic density function theory was used to study the interaction between the CUPRASELECT™ molecule and tantalum nitride surface with a (100) preferred orientation and fragments or dissociated species of the CUPRASELECT™ molecule and tantalum nitride surface. The tantalum nitride contained 50:50 tantalum and nitrogen atoms. The tantalum nitride surface with (100) orientation, according to quantum mechanical calculations, contains alternating tantalum and nitrogen atoms on the surface. This indicates that the CUPRASELECT™ molecule will be exposed to a diffusion barrier surface containing tantalum atoms. Like Example 1, the interaction between the CUPRASELECT™ molecule and the tantalum nitride surface with (100) preferred orientation was determined by the exothermic energy involved in the chemisorption of the $CF_3$ radical on the tantalum nitride barrier layer.

The theoretical results predicted exothermic chemisorption energy of >125 kcal/mol. This energy was noted to be more than sufficient to decompose the CUPRASELECT™ molecule on the tantalum nitride surface with the (100) preferred orientation and cause reaction between the $CF_3$ radical and the tantalum nitride barrier layer. This would result in forming the fluorine, carbon and oxygen containing amorphous layer on the barrier layer and poor adhesion of CVD or ALD deposited copper on the barrier layer.

The theoretical results from the computer simulation indicated that the $CF_3$ radical was selectively adsorbing on the tantalum atoms, decomposing into further fragments, and then reacting with the tantalum atoms. Interestingly, however, no adsorption of the $CF_3$ radical was observed on the nitrogen atoms. These results indicated that exposure of tantalum atoms was responsible for the exothermic chemisorption and decomposition of the $CF_3$ radical on the tantalum nitride surface with (100) preferred orientation. This example revealed that it would not be technically feasible to deposit copper adherently on tantalum nitride surface with (100) preferred orientation as long as tantalum atoms are exposed to the CUPRASELECT™ molecule and its fragments.

Example 3

Copper Deposited by CUPRASELECT™ Upon Tantalum Nitride Barrier Layer Having a Substantially (111) Preferred Orientation A computer simulation program applying the periodic density function theory was used to study the interaction between the CUPRASELECT™ molecule and tantalum nitride surface with a substantially (111) preferred orientation and fragments or dissociated species of the CUPRASELECT™ molecule and tantalum nitride surface. The tantalum nitride contained 50:50 tantalum and nitrogen atoms. The tantalum nitride surface with a substantially (111) preferred orientation, according to quantum mechanical calculations, contains tantalum atoms that are located underneath the nitrogen atoms. This means that the CUPRASELECT™ molecule will not be directly exposed to tantalum atoms. Like the previous examples, the interaction between the CUPRASELECT™ molecule and the tantalum nitride surface with (111) preferred orientation was determined by the exothermic energy involved in adsorbing the $CF_3$ radical on the tantalum nitride barrier layer.

The theoretical results predicted exothermic chemisorption energy of <55 kcal/mol, insufficient to overcome both the activation energy and bond of the C—$CF_3$ bond in the CUPRASELECT™ molecule in addition to supplying ~39 kcal/mol bond energy required to decompose the CUPRASELECT™ molecule.

A more careful look into the theoretical results indicated that the $CF_3$ radicals were not adsorbed onto the tantalum nitride surface with a substantially (111) preferred orientation. In fact, the computer simulation showed that the $CF_3$ radicals were repelled from the surface. This example revealed that it would be technically feasible to deposit copper adherently on tantalum nitride surface with a substantially (111) orientation. It also revealed that it would be technically feasible to deposit copper adherently on tantalum nitride surface as long as tantalum atoms are not exposed to the CUPRASELECT™ molecule.

Example 4

Copper Deposited by CUPRASELECT™ Upon Tantalum Nitride Barrier Layer Having (100) Preferred Orientation After Exposure to Nitrogen Gas A computer simulation program applying the periodic density function theory was used to study the interaction between the CUPRASELECT™ molecule and tantalum nitride surface with (100) preferred orientation after exposure to nitrogen gas. The tantalum nitride contained 50:50 tantalum and nitrogen atoms. The interaction between nitrogen gas and tantalum nitride surface with (100) preferred orientation was determined by the exothermic energy involved in chemisorption of nitrogen on the tantalum nitride barrier layer.

The theoretical results predicted exothermic chemisorption energy of >97 kcal/mol. This energy was more than sufficient to passivate the tantalum nitride surface with (100) preferred orientation with nitrogen as well as burying tantalum atoms under the nitrogen atoms. This meant that a tantalum nitride surface with (100) preferred orientation after exposure to an adhesion promoting agent such as nitrogen would not react with any dissociated $CF_3$ radicals. As a result, the formation of fluorine, carbon and oxygen-containing amorphous layer on the barrier layer would be avoided thereby providing good adhesion of CVD or ALD deposited copper on the barrier layer.

This example revealed that it would be technically feasible to deposit copper adherently on tantalum nitride surface with (100) preferred orientation provided that the tantalum nitride surface is pretreated with an adhesion promoting agent such as nitrogen prior to exposing it to the CUPRASELECT™ molecule and its fragments.

Example 5

Copper Deposited by CUPRASELECT™ Upon Tantalum Nitride Barrier Layer Having a Substantially (111) Preferred Orientation A computer simulation program applying the periodic density function theory was used to study the interaction between the CUPRASELECT™ molecule and tantalum nitride surface with a substantially (111) preferred orientation. The simulation was performed at room temperature (25° C.) and near the CVD copper deposition temperature of 200° C. The theoretical results predicted that the CUPRASELECT™ molecule cleanly deposited copper on the surface without decomposition of the 'hfac' ligand and the protecting olefinic species. The results also revealed that the remaining components of the CUPRASELECT™ molecule did not interact with the surface and were readily removed from the surface in the form of a gas.

This example confirmed the results described in Example 3. Furthermore, it confirmed that it would be technically feasible to deposit copper adherently on tantalum nitride surface with a substantially (111) preferred orientation.

Example 6

Copper Deposited by CUPRASELECT™ Upon Tungsten Barrier Layer Having (100) Preferred Orientation A computer simulation program applying the periodic density function theory was used to study the interaction between the CUPRASELECT™ molecule and tungsten surface with a (100) preferred orientation and fragments or dissociated species of the CUPRASELECT™ molecule and tungsten surface. The theoretical results predicted that CUPRASELECT™ molecule decomposed spontaneously upon exposing to tungsten metal. The energy of 39 kcal/mol required to break the C—$CF_3$ bond within the 'hfac' ligand was considerably lower than the exothermic energy (~272.7 kcal/mol) involved in the chemisorption of the $CF_3$ radical on the tungsten surface. This highly exothermic energy would be responsible for the further decomposition of the $CF_3$ radical into fragments. Rather than volatilizing and escaping the deposition chamber, the fragments react with the tungsten surface, thereby forming a fluorine, carbon and oxygen containing amorphous layer on the barrier layer. This amorphous layer may lower the adherence of a copper layer when deposited onto the tantalum barrier layer.

Due to the formation of the amorphous layer, the present example illustrates that it may be difficult, if not impossible, to deposit copper adherently on tungsten by conventional CVD or ALD processes.

Example 7

Copper Deposited by CUPRASELECT™ Upon Tungsten Nitride Barrier Layer Having a Substantially (111) Preferred Orientation A computer simulation program applying the periodic density function theory was used to study the interaction between the CUPRASELECT™ molecule and tungsten nitride surface with a substantially (111) preferred orientation and fragments or dissociated species of the CUPRASELECT™ molecule and tungsten nitride surface. The tungsten nitride contained 50:50 tungsten and nitrogen atoms with the top layer tungsten atoms fully covered by a monolayer of nitrogen atoms. This means that the CUPRASELECT™ molecule will not be directly exposed to tungsten atoms. Like the previous examples, the interaction between the CUPRASELECT™ molecule and the tungsten nitride surface with a substantially (111) preferred orientation was determined by the exothermic energy involved in adsorbing the $CF_3$ radical on the tungsten nitride barrier layer.

The theoretical results predicted exothermic chemisorption energy of <57.4 kcal/mol. This energy was noted not to be sufficiently high to overcome both the activation barrier and the ~39 kcal/mol required to break the C—$CF_3$ bond in the CUPRASELECT™ molecule This meant that the tungsten nitride surface with a substantially (111) preferred orientation would not facilitate reaction between the $CF_3$ radical and the tungsten nitride barrier layer. This would result in avoiding the formation of fluorine, carbon and oxygen containing amorphous layer on the barrier layer and providing good adhesion of CVD copper on the barrier layer.

This example revealed that it would be technically feasible to deposit copper adherently on tungsten nitride surface with a substantially (111) preferred orientation. It also revealed that it would be technically feasible to deposit copper adherently on tungsten nitride surface as long as tungsten atoms are not exposed to the CUPRASELECT™ molecule.

While the invention has been described in detail and with reference to specific examples thereof, it will be apparent to one skilled in the art that various changes and modifications can be made therein without departing from the spirit and scope thereof.

The invention claimed is:

1. A process for forming a metal film on an at least one surface of a diffusion barrier layer, the process comprising:
providing the at least one surface of the diffusion barrier layer, wherein the diffusion barrier layer comprises at least one material selected from the group consisting of a metal, a metal carbide, a metal nitride, a metal carbonitride, a metal silicon carbide, a metal silicon nitride, a metal silicon carbonitride, and mixtures thereof, wherein the diffusion barrier layer is not substantially free of elemental metal because either (i) the at least one material is the metal, (ii) the diffusion barrier layer has an orientation other than a substantially (111) preferred orientation, or (iii) the diffusion barrier layer has less than 95% of a (111) preferred orientation;
exposing the at least one surface of the diffusion barrier layer to an at least one adhesion promoting agent selected from the group consisting of a nitrogen, a nitrogen-containing compound, a carbon-containing compound, a carbon and nitrogen containing compound, a silicon and carbon containing compound, a silicon, carbon, and nitrogen-containing compound or a mixture thereof, is conducted at a temperature of from 40° C. to 400° C. such that the at least one surface becomes substantially free of an elemental metal; and
forming the metal film on at least a portion of the surface with at least one organometallic precursor by either a chemical vapor deposition or an atomic layer deposition process, wherein the organometallic precursor comprises a metal selected from the group consisting of copper, platinum, nickel, cobalt, palladium, ruthenium, rhodium, iridium, gold, silver, and mixtures thereof
wherein the exposing step is conducted prior to the forming step.

2. The process of claim 1 wherein the exposing step includes plasma activation.

3. The process of claim 1 wherein the chemical vapor deposition is at least one process selected from the group consisting of thermal chemical vapor deposition, plasma enhanced chemical vapor deposition, remote plasma enhanced chemical vapor deposition, plasma assisted chemical vapor deposition, cryogenic chemical vapor deposition, chemical assisted vapor deposition, hot-filament chemical vapor deposition, photo-initiated chemical vapor deposition, or combinations thereof.

4. The process of claim 1 wherein the diffusion barrier layer is a metal nitride selected from the group consisting of chromium nitride, tantalum nitride, titanium nitride, tungsten nitride, molybdenum nitride, zirconium nitride, vanadium nitride, and mixtures thereof.

5. The process of claim 4 wherein the metal nitride is selected from the group consisting of tantalum nitride, titanium nitride, and tungsten nitride.

6. The process of claim 5 wherein the metal nitride is tantalum nitride.

7. The process of claim 1 wherein said diffusion barrier layer is a metal carbide selected from the group consisting of chromium carbide, tantalum carbide, titanium carbide, tungsten carbide, molybdenum carbide, zirconium carbide, vanadium carbide, and mixtures thereof.

8. The process of claim 1 wherein said diffusion barrier layer is a metal carbonitride selected from the group consisting of chromium carbonitride, tantalum carbonitride, titanium carbonitride, tungsten carbonitride, molybdenum carbonitride, zirconium carbonitride, vanadium carbonitride, and mixtures thereof.

9. The process of claim 1 wherein said diffusion barrier layer is a metal silicon nitride selected from the group consisting of tantalum silicon nitride, titanium silicon nitride, molybdenum silicon nitride, and mixtures thereof.

10. The process of claim 1 wherein said diffusion barrier layer is a metal silicon carbide selected from the group consisting of tantalum silicon carbide, titanium silicon carbide, and mixtures thereof.

11. The process of claim 1 wherein said diffusion barrier layer is a metal silicon carbonitride selected from the group consisting of silicon carbonitride, titanium silicon carbonitride, tantalum silicon carbonitride, and mixtures thereof.

12. The process of claim 1 wherein said organometallic precursor is non-fluorinated.

13. The process of claim 1 wherein said organometallic precursor is fluorinated.

14. The process of claim 13 wherein said organometallic precursor comprises hexafluoroacetylacetonate.

15. The process of claim 1 wherein said organometallic precursor comprises an organometallic copper precursor.

16. The process of claim 15 wherein said organometallic copper precursor is 1,1,1,5,5,5-hexafluoro-2,4-pentanedionato-copper (I) trimethylvinylsilane.

17. The process of claim 1 wherein said organometallic precursor is a compound represented by the following structure (I):

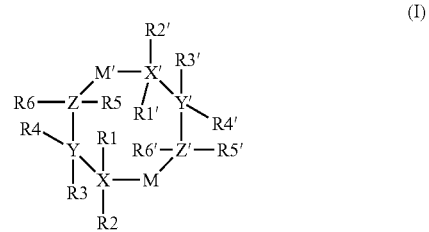

wherein M and M' are each Cu, Ag, Au, Ir, Ru, Rh, or Re;
X and X' are each N or O;
Y and Y' are each Si, C, Sn, Ge, B, or Al;
Z and Z' are each C, N, or O; R1, R2, R1', and R2' are each independently a hydrogen, an alkyl, an alkenyl, an alkynyl, a partially fluorinated alkyl, an aryl, an alkyl-substituted aryl, a partially fluorinated aryl, a fluoroalkyl-substituted aryl, a trialkylsilyl, or a triarylsilyl when X and X' are N;
R1 and R1' are each independently an alkyl, an alkenyl, an alkynyl, a partially fluorinated alkyl, an aryl, an alkyl-substituted aryl, a partially fluorinated aryl, a fluoroalkyl-substituted aryl, a trialkylsilyl, or a triarylsilyl when X and X' are O;
R3, R4, R3', and R4' are each independently a hydrogen, an alkyl, a partially fluorinated alkyl, a trialkylsilyl, a triarylsilyl, a trialkylsiloxy, a triarylsiloxy, an aryl, an alkyl-substituted aryl, a partially fluorinated aryl, a fluoroalkyl-substituted aryl, or an alkoxy; and
R5, R6, R5', and R6' are each independently a hydrogen, an alkyl, an alkenyl, an alkynyl, a partially fluorinated alkyl, an aryl, an alkyl-substituted aryl, a partially fluorinated aryl, a fluoralkyl-substituted aryl, a trialkylsiloxy, a triarylsiloxy, a trialkylsilyl, a triarylsilyl, or an alkoxy;

provided that when X and X' are each 0, there is no substitution at R2 and R2';

further provided that when Z and Z' are each N, there is no substitution at R6 and R6';

further provided that when Z and Z' are each 0, there is no substitution at R5, R6, R5', or R6';

said alkyl and alkoxide having 1 to 8 carbons; said alkenyl and alkynyl having 2 to 8 carbons; and said aryl having 6 carbons.

* * * * *